United States Patent
Rahimo

(10) Patent No.: US 9,455,340 B2
(45) Date of Patent: Sep. 27, 2016

(54) POWER SEMICONDUCTOR DEVICE AND CORRESPONDING MODULE

(71) Applicant: ABB Schweiz AG, Baden (CH)

(72) Inventor: Munaf Rahimo, Uezwil (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/843,631

(22) Filed: Sep. 2, 2015

(65) Prior Publication Data

US 2015/0380534 A1 Dec. 31, 2015

Related U.S. Application Data

(63) Continuation of application No. PCT/EP2014/054830, filed on Mar. 12, 2014.

(30) Foreign Application Priority Data

Mar. 13, 2013 (EP) ..................... 13158963

(51) Int. Cl.
| | |
|---|---|
| *H01L 29/739* | (2006.01) |
| *H01L 29/417* | (2006.01) |
| *H01L 29/10* | (2006.01) |
| *H01L 29/08* | (2006.01) |
| *H01L 29/745* | (2006.01) |
| *H01L 29/749* | (2006.01) |
| *H01L 27/06* | (2006.01) |
| *H01L 29/06* | (2006.01) |

(52) U.S. Cl.
CPC ....... *H01L 29/7395* (2013.01); *H01L 27/0623* (2013.01); *H01L 29/083* (2013.01); *H01L 29/0813* (2013.01); *H01L 29/0821* (2013.01); *H01L 29/1004* (2013.01); *H01L 29/1012* (2013.01); *H01L 29/1016* (2013.01); *H01L 29/1095* (2013.01); *H01L 29/41708* (2013.01); *H01L 29/749* (2013.01); *H01L 29/7455* (2013.01); *H01L 29/0696* (2013.01); *H01L 29/102* (2013.01)

(58) Field of Classification Search
CPC ............. H01L 29/7455; H01L 29/749; H01L 29/1016
USPC ......................................................... 257/140
See application file for complete search history.

(56) References Cited

U.S. PATENT DOCUMENTS

| | | | |
|---|---|---|---|
| 6,091,087 A | 7/2000 | Iwamuro et al. | |
| 2007/0145408 A1* | 6/2007 | Menard | H01L 29/0692 257/107 |
| 2013/0026537 A1* | 1/2013 | Rahimo | H01L 29/4232 257/139 |

FOREIGN PATENT DOCUMENTS

| | | |
|---|---|---|
| EP | 0359994 A1 | 3/1990 |
| WO | 2012113818 A2 | 8/2012 |

OTHER PUBLICATIONS

International Preliminary Report on Patentability, Application No. PCT/EP2014/054830, Date Issued: Sep. 15, 2015, 8 pages.
European Search Report, Application No. EP 13 15 8963, Completed: Oct. 31, 2013; Mailing Date: Nov. 8, 2013, 9 pages.

* cited by examiner

*Primary Examiner* — Walter H Swanson
(74) *Attorney, Agent, or Firm* — Whitmyer IP Group LLC

(57) ABSTRACT

Power semiconductor device having a wafer, including emitter and collector electrodes arranged on opposite sides, wherein a gate electrode arranged on the emitter side has a conductive gate layer and an insulating layer arranged in the following order between the collector and emitter side: a p doped collector layer, an (n−) doped drift layer, an n doped enhancement layer, a p based base layer having a first and second base region, and an (n+) doped first and second emitter layer, wherein the emitter electrode contacts the first emitter layer and the first base region at an emitter contact area, wherein the second emitter layer is insulated from a direct contact to the emitter electrode by the insulating layer and wherein the second emitter layer is separated from the first emitter layer by the base layer.

19 Claims, 15 Drawing Sheets

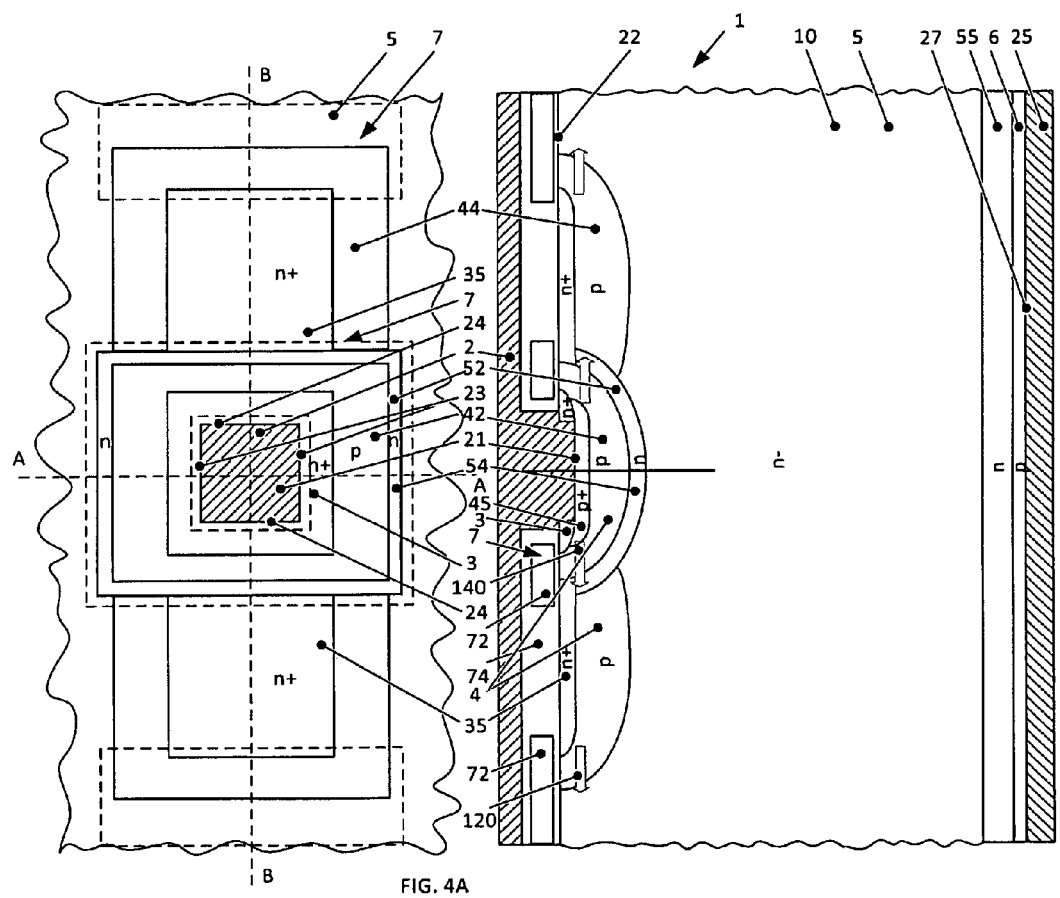

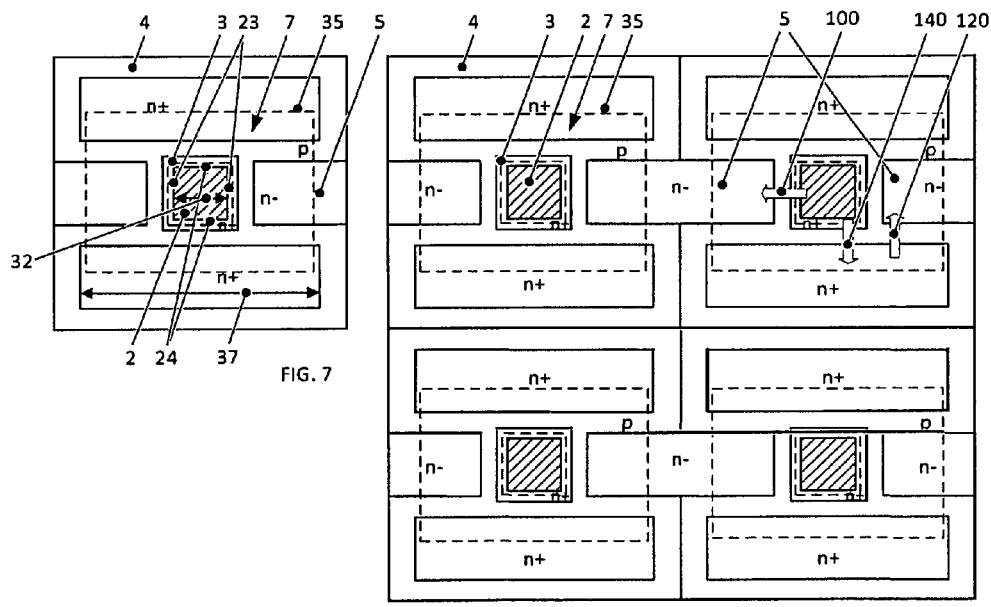

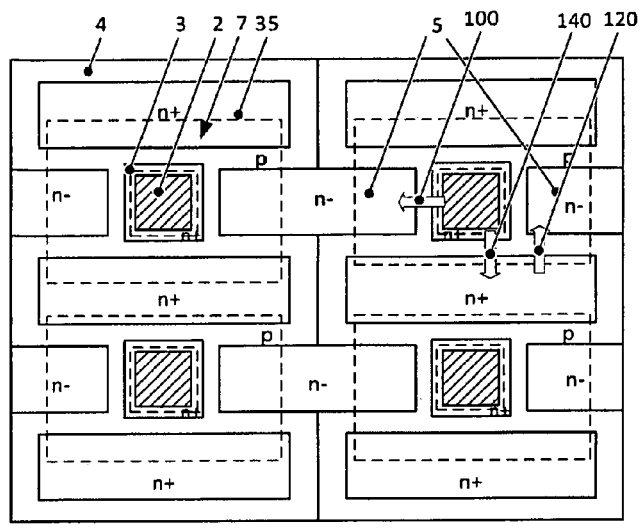
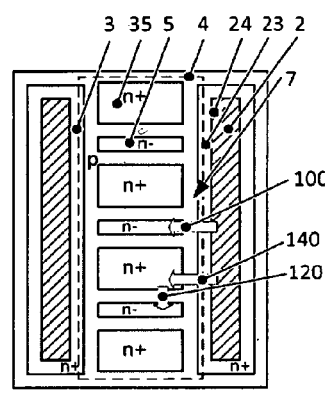
FIG. 10
FIG. 12
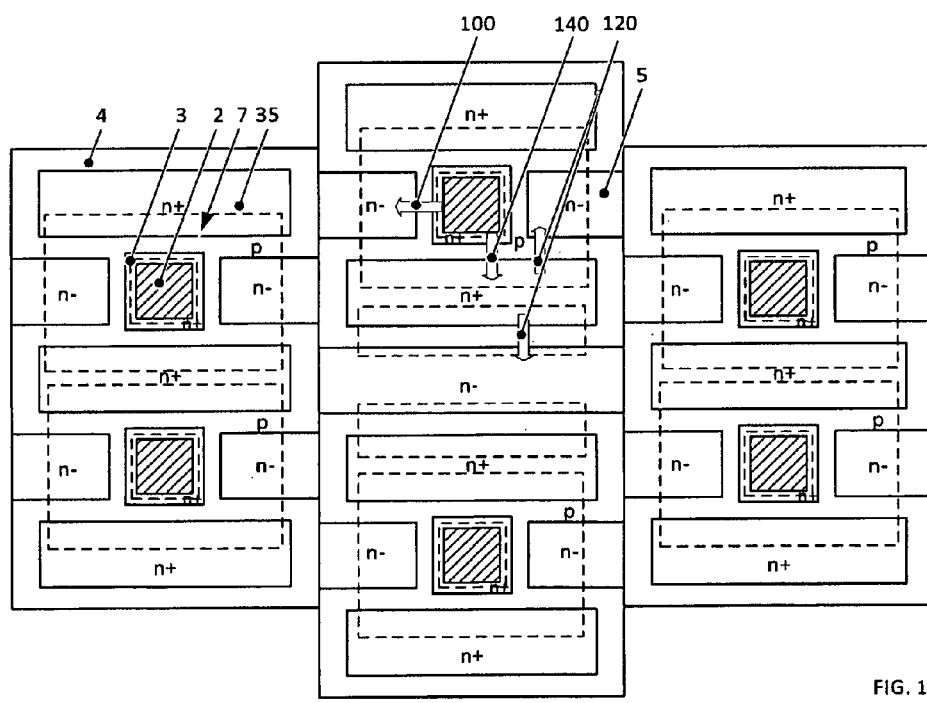
FIG. 11

POWER SEMICONDUCTOR DEVICE AND CORRESPONDING MODULE

FIELD OF THE INVENTION

The invention relates to the field of power electronics and more particularly to a power semiconductor device.

BACKGROUND OF THE INVENTION

In FIG. 1A and FIG. 1B an emitter switched thyristor (EST) 100 is shown, which comprises a wafer 10 having an emitter and a collector side 22, 27, on which sides an emitter electrode 2 and a collector electrode 25 are arranged. On the emitter side 22, a planar or trench gate electrode 7 is arranged, which comprises an electrically conductive gate layer 72, a further gate layer 76 and an insulating layer 74, which insulates the gate layer 72 and 76 from any layer of the first or second conductivity type in the wafer 10 and from each other. FIG. 1A shows a top view on the device 100, whereas FIG. 1B shows a cut along the line A-A in FIG. 1A.

Like in an IGBT, on the emitter side 22, an n doped first emitter layer 3, which extends to a region below the gate layer 72 and a p doped base layer 4 surrounding the first emitter layer 3 are arranged. The first emitter layer 3 and the base layer 4 contact the emitter electrode 2 at an emitter contact area 21. The device further comprises on the emitter side 22 a second n doped emitter layer 35, which is insulated from the emitter electrode 2 by the insulating layer 74. The second emitter layer 35 extends from a region below the gate layer 72 to a region below a further gate layer 76, which completely surrounds the gate layer 72.

Towards the collector electrode 25, a lowly (n−) doped drift layer 5 and a p doped collector layer 6 are arranged.

In this device, a MOS channel 140 is formable from the first emitter layer 3 via the base layer 4 to the second emitter layer 35. In the device, another channel in form of a thyristor channel 120 is formable during operation from the second emitter layer 35 via the base layer 4 to the drift layer 5.

The EST uses a cascade concept, in which a low voltage MOSFET is integrated in series with a thyristor structure, such that by turning off the MOSFET, the thyristor is turned off. Due to the shorted base layer the EST provides a MOS voltage controlled turn-on switching, a higher diode safe operating area and handling fault conditions when compared to the IGCT. Such a device has limited short circuit capability depending on its low voltage MOSFET blocking and higher on-state snapback effects.

Also the on-state losses are higher due to the low voltage MOSFET channel resistance than for a prior art IGCT. The base layer is shorted in the EST devices, so that the thyristor structure enhancement effect is reduced due to hole drainage, and hence this results in higher on-state losses. The on-state suffers from a snap-back effect before the thyristor areas are latched since conduction occurs initially through the two channels.

U.S. Pat. No. 6,091,987 describes a dual EST device, in which a first and second emitter region as well as a first and second base region are separated by the drift layer. Due to the distance between the two emitter regions and the presence of both base regions in between, there is no MOS channel formable in this device. The thyristor channels are not connected to the IGBT cell. Such a device results in high on-state losses due to a strong contribution of the IGBT drainage.

SUMMARY OF THE INVENTION

It is an object of the invention to provide a power semiconductor device, which provides lower on-state losses by having better carrier enhancement at the emitter, while having good MOS controllability and higher safe operating area than prior art devices, in particular EST devices.

This object is achieved by providing an inventive power semiconductor device comprising a wafer, on which an emitter electrode is arranged on an emitter side of the wafer and a collector electrode is arranged on a collector side of the wafer opposite to the emitter side. In the wafer, various layers of a first or of a second conductivity type, which is different from the first conductivity type, are arranged.

As shown in FIG. 2A, the wafer comprises layers in the following order from the collector side towards the emitter side: a collector layer of the second conductivity type, a lowly doped, exemplarily uniformly doped drift layer of the first conductivity type, an enhancement layer of the first conductivity type, which has higher doping concentration than the drift layer and which comprises a first enhancement region, a base layer of the second conductivity type, which comprises a first and a second base region, and a first and a second emitter layer of the first conductivity type.

A planar gate electrode is arranged on the emitter side, which gate electrode comprises an electrically conductive gate layer and an insulating layer, which insulates the gate layer from any layer of the first or second conductivity type in the wafer.

The first enhancement region is arranged between the first base region and the drift layer such that the first enhancement region separates the first base region from the second base region and the drift layer, but contacts the second emitter layer. The first enhancement region is arranged such that the first base region does not contact the drift layer. Thus, the first enhancement layer encloses the first base region towards the drift layer.

Both first and second emitter layers are arranged at the emitter sided surface of the wafer between the base layer and the emitter electrode. The first emitter layer as well as the first base region contact the emitter electrode at an emitter contact area. The first emitter layer is separated from the drift layer and from the second emitter layer by the first base region and the first enhancement region. The second emitter layer is separated from the drift layer by the second base region. The second emitter layer contacts the first enhancement region. The second emitter layer is configured differently from the first emitter layer in that the second emitter layer is no in contact with the emitter electrode, but insulated from it by the insulating layer.

In the device, three different channels are formable during operation of the device. An IGBT channel is formable from the first emitter layer via the first base region and the first enhancement region to the drift layer, i.e. charges can flow from the emitter electrode to the drift layer.

The second channel is a thyristor channel, which is formable from the second emitter layer via the second base region to the drift layer.

The third channel is a MOS channel, formable from first emitter layer via the first base region and the first enhancement region to the second emitter layer. Depending on the design of the layers, the channels can be formed at different locations.

A cascade of channels is formable from the first emitter layer to the drift layer via the MOS channel and the thyristor channel. The carriers flow from the first emitter layer via the first base region and the first enhancement region to the second emitter layer and further via the second base region to the drift layer, so that the carriers have to flow through both channels (i.e. the cascade of the MOS and thyristor channels) to enter the drift layer.

The first enhancement region contacts the second emitter layer and acts as an extension to the first enhancement region where the highly doped emitter layer will provide the high plasma for lower losses (thyristor action) and isolate the drainage of plasma for the first base region to achieve the optimum plasma. Thus, the inventive device incorporates an IGBT structure and an EST structure in one device. The channels can be formed in different directions, e.g. the MOS and thyristor channel can be formed in a first direction and the IGBT channel can be formed in another direction, exemplarily perpendicular to the first direction in a plane parallel to the emitter side. Any other arrangement of the channels can also be realised as exemplarily MOS and IGBT channels can be arranged parallel to each other and the thyristor channel is arranged in another direction.

FIG. 2B shows a cut of the device along the line B-B shown in FIG. 2A. In this cut, a thyristor and a MOS channel as known from the prior art EST devices (FIG. 1) are shown. However, in a cut perpendicular to the cut of FIG. 2B, i.e. along the line A-A the device comprises an IGBT channel. This channel does not exist in prior art EST device, because the gate layer and the emitter layers are arranged in such devices in a closed shape around the emitter contact area so that this device only has MOS and thyristor channels (FIG. 1B).

Due to the introduction of additional IGBT channel the device has less drainage effect and the IGBT and Thyristor sections can be optimized independently depending on the electrical and geometrical requirements. The parallel IGBT provides options for gate driving and improved turn-off capability. Also the MOS channel can be designed independently so that the device provides low losses.

Due to the different channels, the device provides a high level of carrier enhancement at the emitter and lower hole drainage, hence the on state losses are reduced.

Due to the enhancement layer 52, there is an improvement in plasma distribution, current enhancement at the IGBT channel and improved latch up properties so that on state losses are reduced. High doping concentrations of the enhancement layer can be chosen for improved carrier enhancement.

The inventive structure of the three different IGBT, MOS and thyristor channels can be integrated into various different semiconductor devices like punch-through devices (having a highly doped buffer layer of the first conductivity type arranged between the drift layer and the collector layer) and non punch-through devices (which do not have such a buffer layer, i.e. at which the drift layer contacts the collector layer), reverse conducting devices devices (at which in the plane of the collector layer the collector layer alternates with a highly doped layer of the first conductivity type), optimization of the geometrical structures of the layers as to form exemplarily cell or strip shapes. If desired, the doping concentrations of the first and second emitter layers and the base layer below these emitter layers can be adapted independently, as to achieve different threshold voltages for the MOS and the IGBT channel. The device may also comprise pure diode sections for bimode operation.

A highly doped enhancement layer can be integrated into the IGBT section without influencing the MOS and thyristor section so that the IGBT charge enhancement and high latch up immunity is improved. In the IGBT section, also a highly doped p contact layer can be integrated, at which the emitter electrode contact the p doped layer for improvement of electrical properties and especially the safe operating area.

The size of each IGBT, MOS and thyristor sections and the ratio of the sizes to each other can be optimized.

Furthermore, the device can be manufactured using self-aligned masks for the emitter sided layers.

BRIEF DESCRIPTION OF THE DRAWINGS

The subject matter of the invention will be explained in more detail in the following text with reference to the attached drawings, in which:

FIGS. 2A-2C, FIGS. 3A-3C, FIGS. 4A-4C, and FIGS. 5A-5C show in the figures A top views on various inventive power semiconductor devices, in the figures B and figures C cuts along the line A-A and B-B;

FIG. 7-FIG. 14 show top views on various inventive semiconductor devices.

DETAILED DESCRIPTION OF THE INVENTION

Figure 1A:
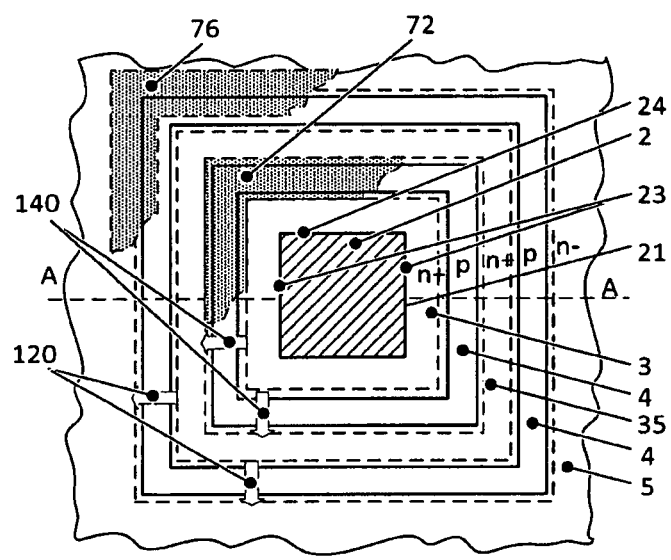
FIGS. 1A-1B show a prior art EST device.
Figure 1B:
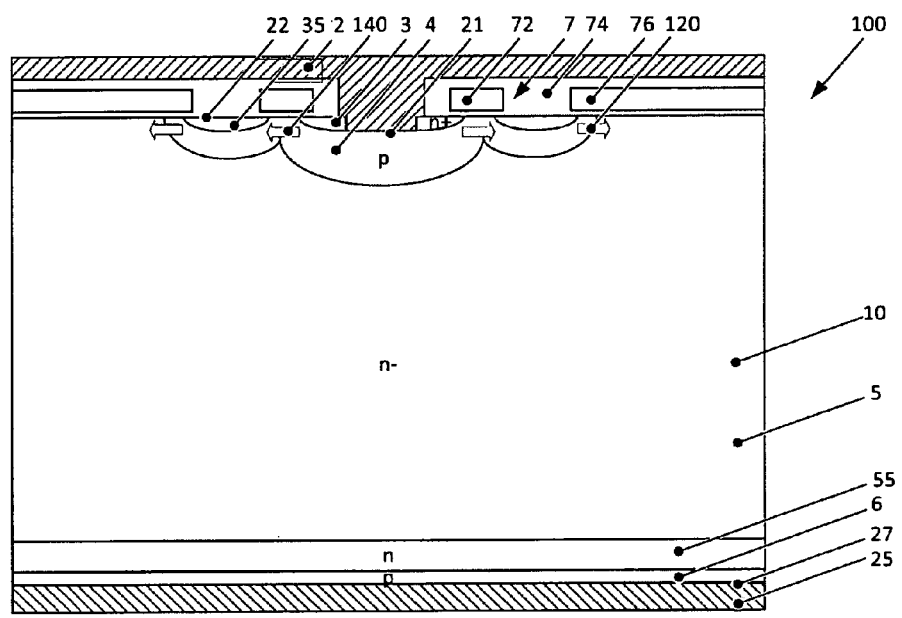
Figures 2A, 2B:
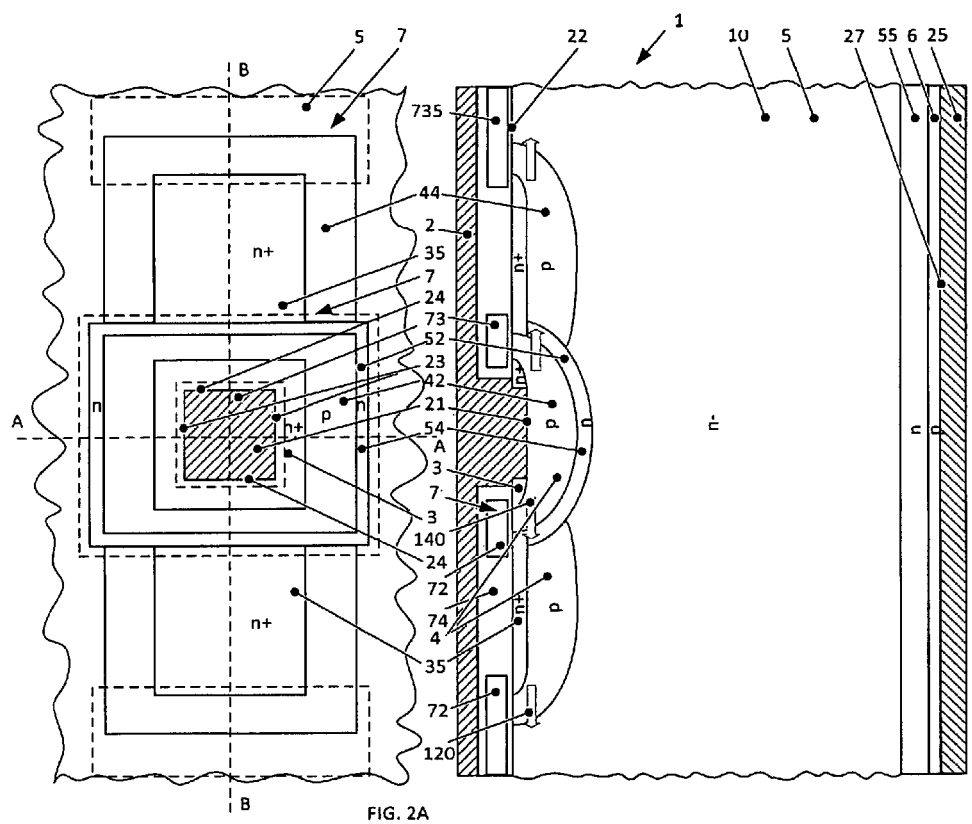
Figure 2C:
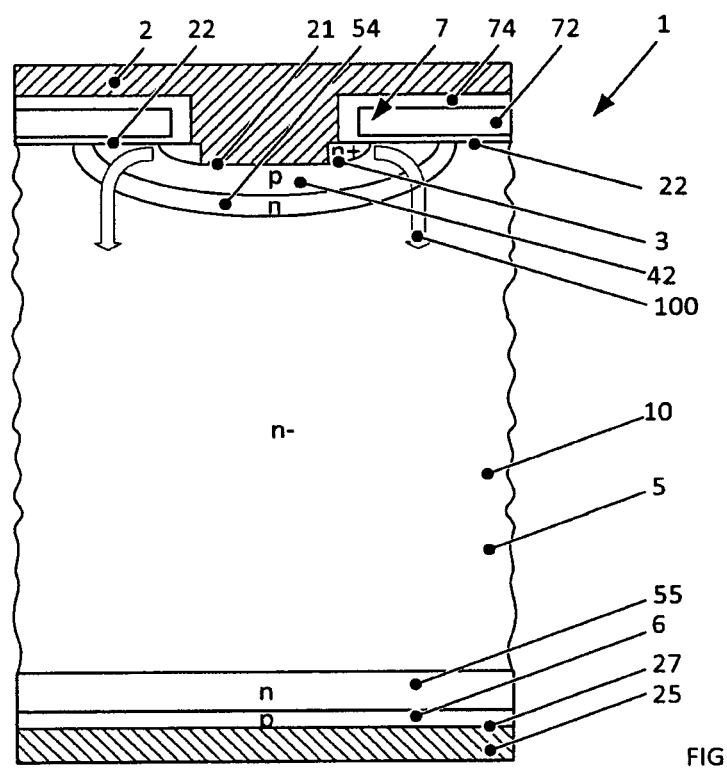
Figure 6:
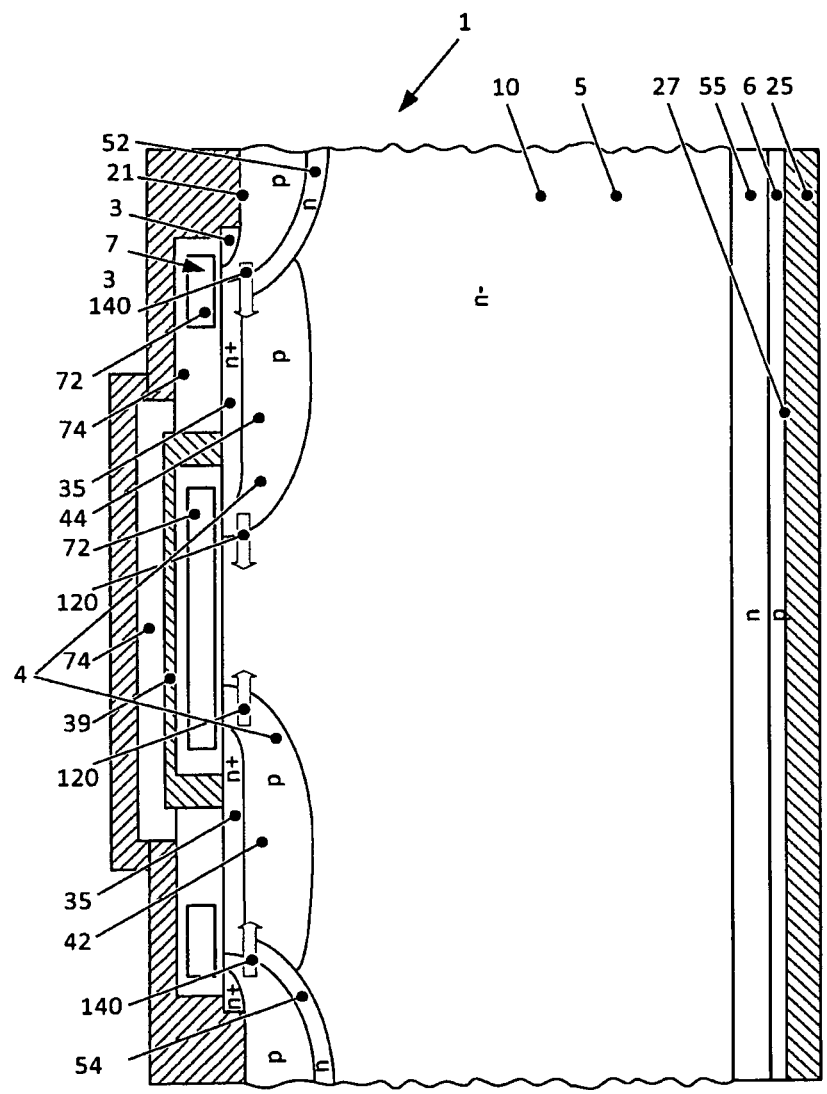
FIG. 6 shows a cut along the line B-B through another inventive power semiconductor device.

An inventive power semiconductor device 1 as shown in FIG. 2 comprises a wafer 10, on which wafer 10 an emitter electrode 2 is arranged on an emitter side 22 of the wafer and a collector electrode 25 is arranged on a collector side 27 of the wafer opposite to the emitter side 22. FIG. 2A shows a top view on the device 1, whereas FIG. 2B shows a cut along the line B-B in FIG. 2A and FIG. 2C show a cut along the line A-A in FIG. 2A. FIGS. 3A-5C show the same views for different inventive devices, whereas FIG. 6 shows a cut along the line B-B in FIG. 2A at a shifted section of the device.

The wafer comprises n and p doped layers between the collector side 27 and the emitter side 22 in the following order: a p doped collector layer 6, a constantly low (n−) doped drift layer 5, an n doped enhancement layer 52, which has a higher maximum doping concentration than the drift layer 5 and which comprises a first enhancement region 54, a p doped base layer 4, which comprises a first base region 42 and a second base region 44, and first and second highly n doped emitter layers 3, 35, which have a higher maximum doping concentration than the drift layer 5 and the enhancement layer 52.

In such a device, three different sorts of channels are present. For clarity reasons, the channels are not shown in all figures. An IGBT channel 100 is formable from the first emitter layer 3 via the first base region 42 and the first enhancement region 54 to the drift layer 5 (e.g. shown in FIG. 2C). At the IGBT channel 100, the drift layer 5 extends to the emitter sided surface of the wafer below the same gate layer 72, below which the first emitter layer 3 is arranged (i.e. the first emitter layer 3 extends to a region below the same gate layer 72, below which the drift layer 5 extends to).

A thyristor channel 120 is formable from the second emitter layer 35 (which is not connected to the emitter electrode 2) via the second base region 44 to the drift layer 5. At the thyristor channel 120, the drift layer 5 extends to the emitter sided surface of the wafer below the gate layer 72.

A MOS channel 140 is formable from first emitter layer 3 via the first base region 42 and the first enhancement layer 54 to the second emitter layer 35 (e.g. shown in FIG. 2B). A single gate layer 72 extends at the MOS channel 140 from a region above the first emitter layer 3 to a region above the second emitter layer 35 with the first base region 42 in between. No drift layer extends at the MOS channel 140 (i.e.

between the first and second emitter layer 3, 35) to the emitter sided surface of the wafer.

The first and second highly doped emitter layers 3, 35 are arranged at the emitter sided surface of the wafer in the same plane. The emitter layers 3, 35 are highly doped such that they have higher doping concentration than the drift layer 5. Exemplarily, the emitter layers 3, 35 have the same maximum doping concentration. The emitter layers 3, 35 may be formed as diffused layers, i.e. have a maximum doping concentration, beyond which (i.e. towards greater depths in the wafer) the doping concentration decreases. The first emitter layer 3 as well as the first base region 42 contact an emitter electrode 2 at an emitter contact area 21. Exemplarily, the first emitter layer 3 is a self-contained, i.e. closed layer, which surrounds the emitter contact area 21 laterally, i.e. in a plane parallel to the emitter side 22. The emitter electrode 2 contacts the first base region 42 and the first emitter layer 3 at the emitter contact area 21. The second emitter layer 35 is insulated from a contact to the emitter electrode 2 by the insulating layer 74. Thus, the second emitter layer 35 is not in touch with the emitter electrode 2 or any other controllable electrode so that the MOS channel is formed from the first to the second emitter layer 3, 35.

An n doped enhancement layer 52 is arranged between the base layer 4 and the drift layer 5. The enhancement layer 52 separates the base layer 4 from the drift layer 5. Exemplarily, the drift layer 5 has a constantly low doping concentration and the enhancement layer 52 has a higher doping concentration than the drift layer 5. Therein, the substantially constant doping concentration of the drift layer 5 means that the doping concentration is substantially homogeneous throughout the drift layer 5, however without excluding that fluctuations in the doping concentration within the drift layer being in the order of a factor of one to five may be possibly present due to e.g. a manufacturing process of the wafer being used.

The first enhancement region 54 contacts the second emitter layer 35. The enhancement layer 52 is formed such that it completely separates the p doped first base region 42 from the n− doped drift layer 5. Thus, the first enhancement region 54 is arranged in the IGBT part of the device, i.e. below the emitter contact area 21 and surrounding the emitter contact area 21 up to the regions at which the IGBT channel is formed (FIG. 2) and extends to the second emitter layer 35 so that the MOS channel 140 is arranged across the first enhancement region 54.

Figures 3A, 3B:
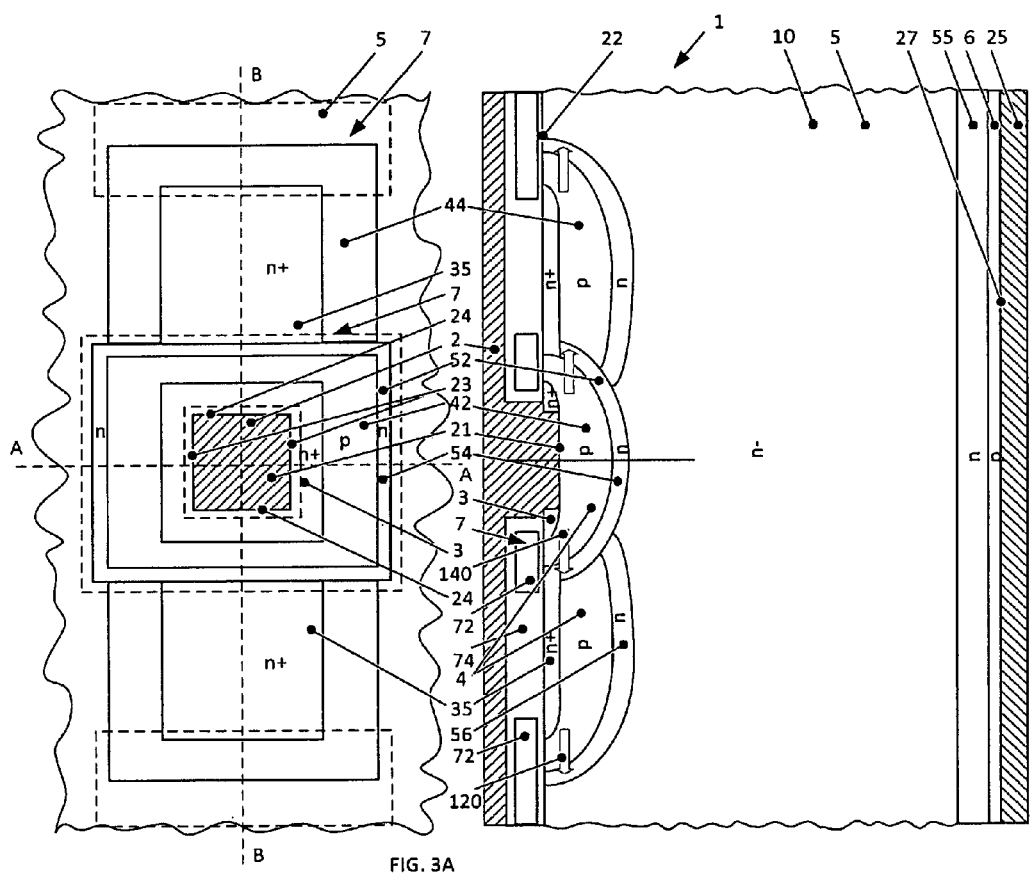
Figure 3C:
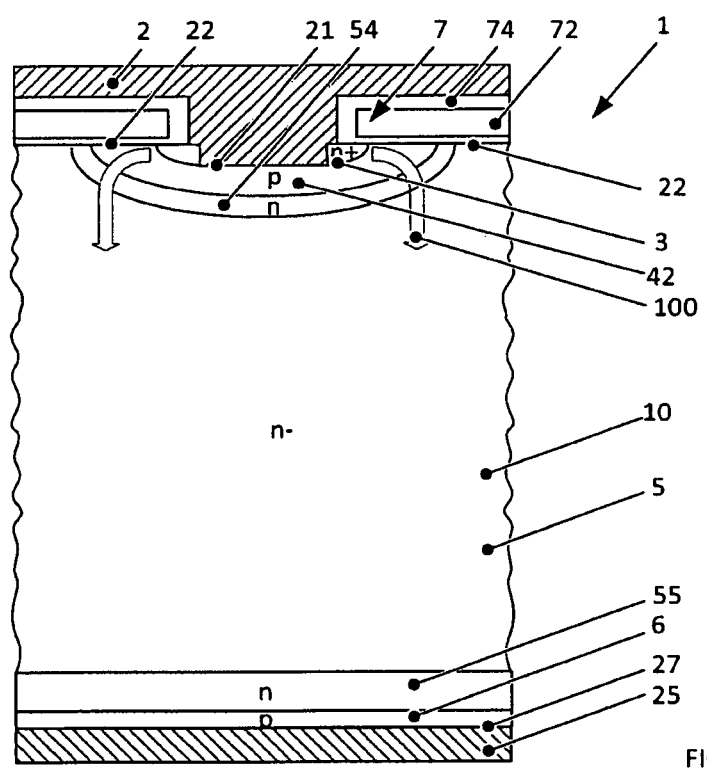

A second enhancement region 56 may be formed such that it separates the second base region 44 from the drift layer 5 (FIG. 3). It is connected to the first enhancement region 54, so that both enhancement regions 54, 56 completely separate the first and second base region 42, 44 from the drift layer 5.

The enhancement layer 52 (first and/or second enhancement region 54, 56) may be a diffused layer having a maximum doping concentration, wherein the doping concentration decreases steadily from the depth of maximum doping concentration towards greater depths in the wafer from the emitter side 22 in a central part of the first enhancement region 54 and/or the second enhancement region 56. The enhancement layer 52 (first and/or second enhancement region 54, 56) may exemplarily have a maximum doping concentration between $5*10^{15}$ cm$^{-3}$ and $5*10^{17}$ cm$^{-3}$. In another exemplary embodiment, the second enhancement region 56 has a lower maximum doping concentration than the first enhancement region 52, e.g. $5*10^{15}$ cm$^{-3}$ to $2*10^{16}$ cm$^{-3}$.

An exemplary doping concentration of the drift layer 5 is between $5*10^{12}$ cm$^{-3}$ and $1.5*10^{14}$ cm$^{-3}$. The first and second emitter layers 3, 35 have exemplarily a maximum doping concentration higher than $1*10^{18}$ cm$^{-3}$.

The base layer 4 is arranged between the drift layer 5 and the emitter electrode 2. The base layer 4 separates the emitter layers 3, 35 from the drift layer 5. Additionally, the base layer 4 separates the first and second emitter layer 3, 35 from each other. The base layer 4 extends to the emitter sided surface of the wafer between the first and second emitter layers 3, 35. The base layer 4 also extends to the emitter sided surface of the wafer between the second emitter layer 35 and the drift layer 5.

The base layer 4 comprises a first base region 42 at the emitter contact area 21 to an area below the first emitter layer 3 and a second base region 44 extending below the area of the second emitter layer 35, which extends to the emitter side 22 at an area below the gate layer 72 at the thyristor channel 120. The first base region 42 is completely separated from the second base region 44 by the first enhancement region 54, which extends to the emitter sided surface of the wafer between the first and second base regions 42, 44. In such an inventive device, the maximum doping concentrations of the first and second base region, i.e. the first and second maximum doping concentrations, can be adapted independently. E.g. the second maximum doping concentration of the second base region can be chosen to be lower than the first maximum doping concentration of the first base region in order to improve the thyristor latch-up capability, i.e. the device latches up at the thyristor channel 120 at lower currents than in a device, in which the second maximum doping concentration is higher. In the IGBT section, the first maximum doping concentration can be chosen higher than the second maximum doping concentration.

In an exemplary embodiment, the first maximum doping concentration may be between $1*10^{17}$ cm$^{-3}$ and $1*10^{18}$ cm$^{-3}$. The second maximum doping concentration may be between $1*10^{16}$ cm$^{-3}$ and $1*10^{17}$ cm$^{-3}$; exemplarily the second maximum doping concentration is by a factor of 2 to 10 smaller than the first maximum doping concentration. In another exemplary embodiment, the first and second base regions 42, 44 have the same maximum doping concentrations.

A planar gate electrode 7 is arranged on the emitter side 22, which gate electrode 7 comprises an electrically conductive gate layer 72 and an insulating layer 74, which insulates the gate layer 72 from any layer of the first or second conductivity type in the wafer 10 extending to the emitter sided surface of the wafer in an area below the gate layer 72. The gate layer 72 is arranged on the emitter sided surface of the wafer 10 laterally to the emitter contact area 21. It extends to an area above the base layer 4, the first emitter layer 3 and the second emitter layer 35 as well as the drift layer 5. Depending on the design of the inventive device, the gate layer 72 may comprise a first and second electrically conductive layer 73, 735 (only indicated in FIG. 2B), both of which are arranged on the emitter sided surface of the wafer 10 and insulated from any layer of the first or second conductivity type in the wafer 10 by the insulating layer 74. The first electrically conductive layer 73 may be formed as a closed layer, which surrounds an emitter contact area 21 and which is laterally limited to an area above the first emitter layer 3 and extends above an area, at which the first base region 42 extends to the emitter sided surface of the wafer between the first and second emitter layer 3, 35 further to an area above the second emitter layer 35 (or at least the second enhancement layer 56, which contacts the second emitter layer 35).

The second electrically conductive layer 735 may be formed from an area above the second emitter layer 35, extends through another area, below which the second base region 44 extends to the emitter sided surface of the wafer at the thyristor channel 120, further to an area, below which the drift layer 5 extends to the emitter sided surface of the wafer. The first and second electrically conductive layers 73, 735 are separated from each other by the insulating layer 74. Depending on the design, there also may be just one single gate layer 72 used for creating a MOS, IGBT and thyristor channel 140, 100, 120.

Figure 4C:
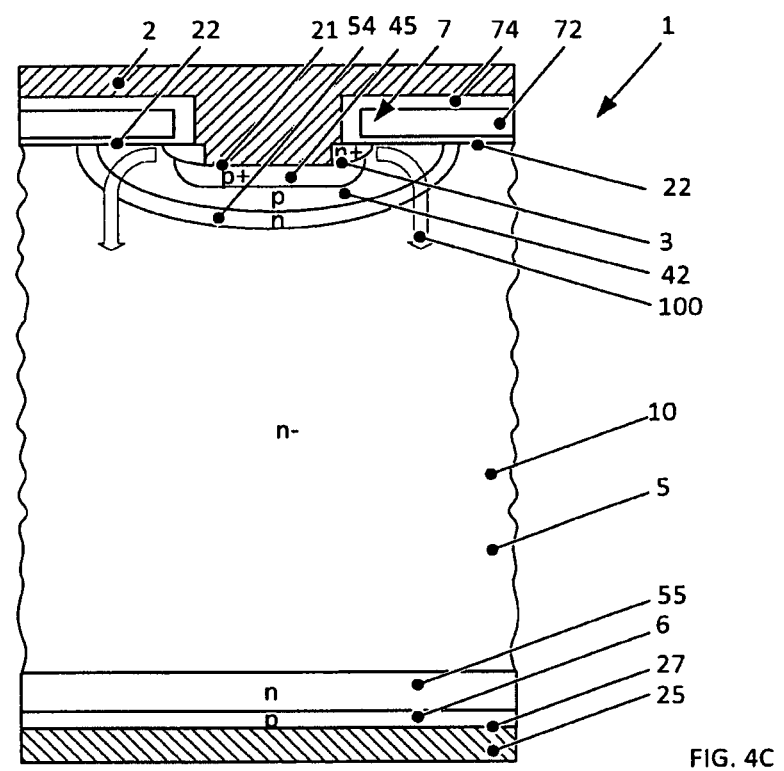
Figures 5A, 5B:
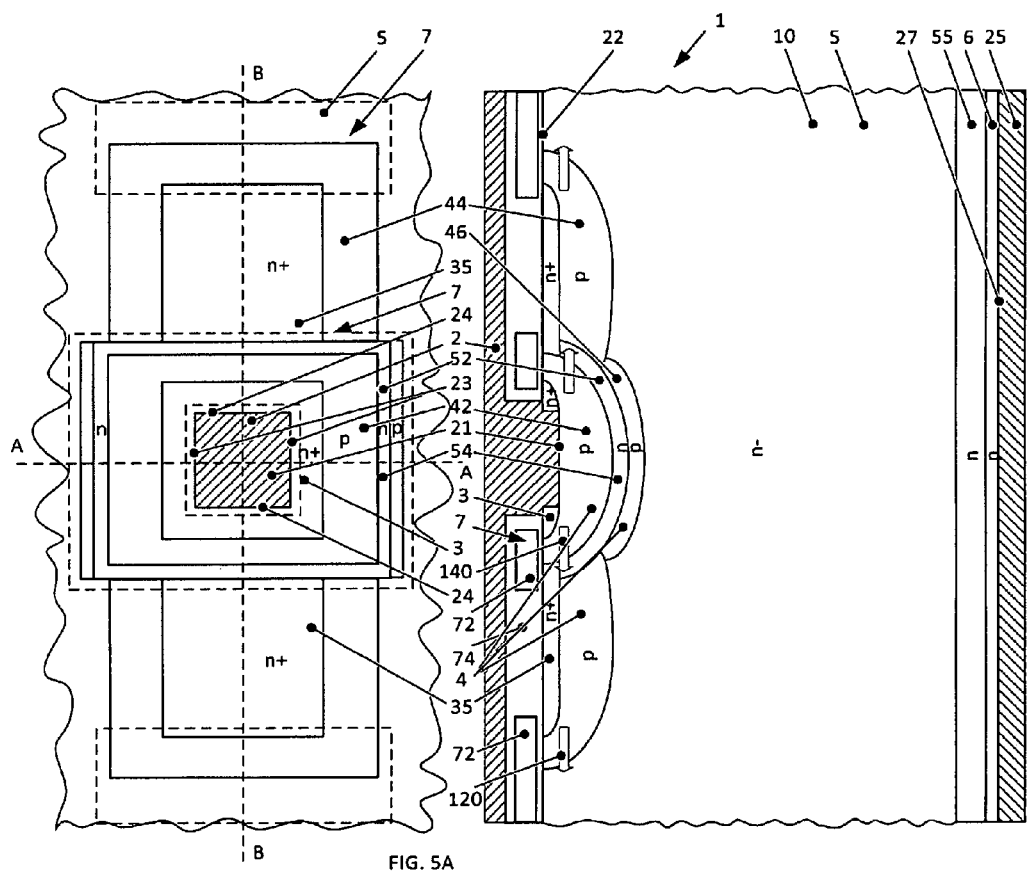
Figure 5C:
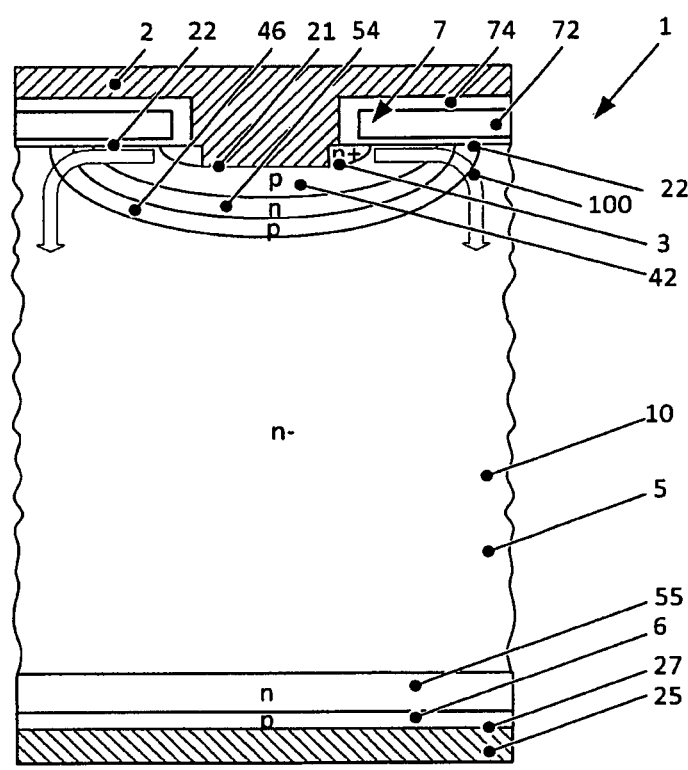

In FIG. 4 another inventive embodiment is shown, in which the device 1 comprises a highly p+ doped contact layer 45, which is arranged in between the emitter contact area 21 and the p doped first base region 42 in order to have a highly doped interlayer at the contact to the emitter electrode 2. The p contact layer 45 may be limited to the area at which a p doped layer is in contact to the emitter electrode 2, i.e. at the emitter contact area 21.

The contact layer 45 may have a maximum doping concentration between $5 \times 10^{18}/cm^3$ and $5 \times 10^{19}/cm^3$ whereas the base layer 4 exemplarily has a maximum doping concentration between $1 \times 10^{17}/cm^3$ and $1 \times 10^{18}/cm^3$. The contact layer and base layer 4, 45 may be formed as diffused layers, i.e. as overlaid layers, in which the doping concentration of each layer decreases, but the contact layer 45 is arranged up to a first depth, which is smaller than the depth of the base layer (measured from the emitter side 22). The layers 4, 45 overlap such that at the cross point a discontinuous decrease of the doping concentration is present.

Shown in FIG. 5 is another inventive device 1, which comprises a third base region 46, which is arranged between the first enhancement region 54 and the drift layer 5, so that the first enhancement region 54 is completely separated from the drift layer 5. The third base region 46 is connected to the second base region 44 so that by this arrangement plasma distributions are improved. The third base region 46 has exemplarily a maximum doping concentration, which is the same or lower than the second maximum doping concentration of the second base region 42, e.g. $1 \times 10^{16}/cm^3$ to $1 \times 10^{17}/cm^3$. The maximum doping concentration of third base region 46 is lower than the maximum doping concentration of the first enhancement region 54.

Of course, also elements of the disclosed inventive elements can be combined. For example, not shown in a figure, the device may comprise a p contact layer together with a p doped third base region 46.

A power semiconductor module may be formed by at least two semiconductor devices 1, which are arranged on a common wafer 10, wherein the devices are exemplarily arranged in a regular manner. Exemplarily, the devices are arranged such that the device shown in the FIGS. 2B to 5B are arranged repetitively.

Such a module comprises at least two second emitter layers 35 and it may also comprise an electrically conductive connection layer 39, which electrically connects the at least two second emitter layers 35 of the at least two power semiconductor devices with each other. FIG. 6 shows such an inventive device, which is a cut through an inventive device along a line corresponding to line B-B of FIG. 2A, but at a shifted section. The connection layer 39 is arranged on the wafer 10. Such a connection layer 39 may be formed above and contacts the second emitter layers 35 belonging to two neighbored devices 1. The connection layer is electrically insulated from the emitter electrode 2 (or any other electrode) and the gate layer 72 by the insulating layer 74. The connection layer 39 is, therefore, a floating layer, which may be formed of a metal. Such a connection layer 39 enhances the current distribution between the two connected thyristor regions, and thus improves the electrical properties of the device.

The emitter contact area 21 may comprise in a plane parallel to the emitter side 22 two first sides 23 opposite to each other, wherein the IGBT channel 100 is formable at the two first sides 23 of the emitter contact area 21, what shall mean that the channel is formed at such part of the first emitter layer 3, to which the first sides 21 are neighbored (closest side to the first emitter layer 3). Thus, IGBT channels 100 are formable at two opposite sides of the emitter contact are 21.

The term that the channel is formed "at a side" of the emitter contact area 21 shall not mean that the channel is formed through the first side, but it is formed from a region of the first emitter layer 3, which are in touch with the appropriate side, i.e. the channel is formed from such part of the first emitter layer 3, which is arranged between the appropriate side and such part of the drift layer 5, to which the channel extends.

Figure 13:
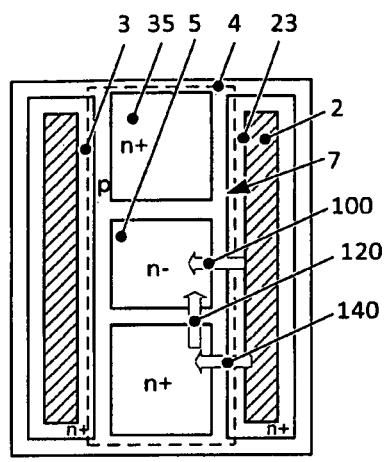

The emitter contact area 21 may comprise in a plane parallel to the emitter side 22 two second sides 24 opposite to each other, which second sides 24 are arranged perpendicular to the first sides 23. The MOS channel 140 may be formable at the two second sides 24 of the emitter contact area 21. Alternatively, the MOS channels 140 may also be formed at the same sides (i.e. the first sides 23) as and alternatingly to the IGBT channels 100 (as e.g. shown in the FIGS. 12 to 14). The thyristor channel 120 may be formed in a plane parallel to the emitter side 22 parallel to the direction, in which the MOS channel 140 is formed, or perpendicular to that direction.

Figure 9:
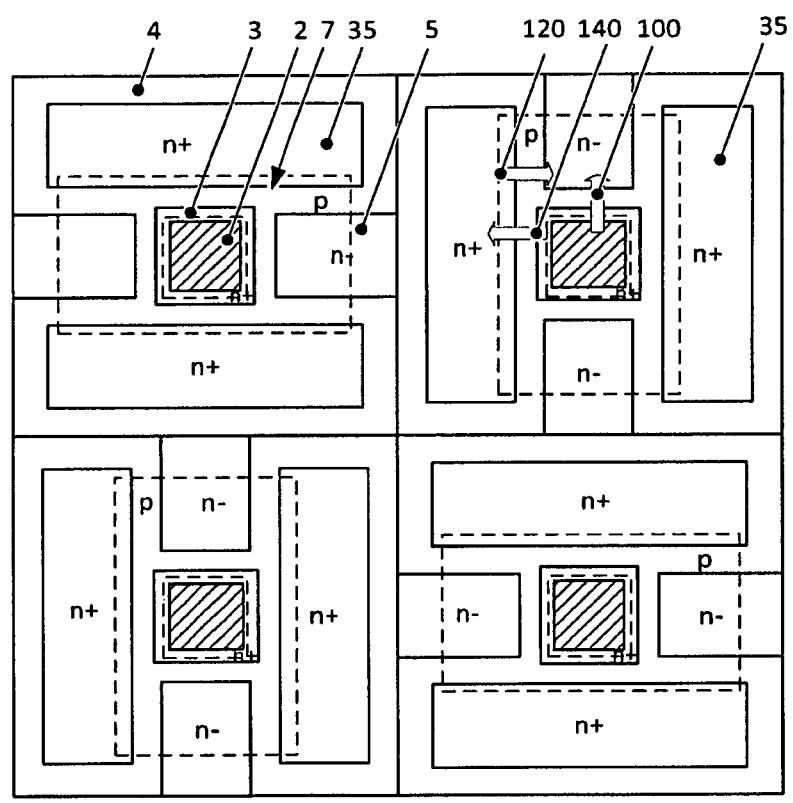

As shown in FIG. 7, a unit may be formed by one emitter contact area 21, the surrounding first emitter layer 3, two second emitter layers 35 at the opposite second sides 24 of the emitter contact area 21, the base layer 4 and the drift layer at the two first sides 23. The semiconductor device 1 may comprise a plurality of such units, which are arranged in a regular manner. The units may be arranged in line to each other (FIG. 8), each unit having the same orientation (first sides of a first unit is parallel to the first sides of the units neighbored to the first unit) or the units may be arranged such that they are rotated by 90° to each other so that the first sides of a first unit is perpendicular to the first sides of the units neighbored to the first unit (FIG. 9).

Thus, in FIG. 8 a plurality of emitter contact areas 21 are arranged in first rows with the first sides 23 arranged perpendicular to the first row, and a plurality of second emitter layers 35 are arranged in second rows parallel to the first rows. In the first row, no second emitter layers 35 are arranged, whereas in the second rows, no first emitter contact areas 21 or first emitter layers 3 are arranged. In between two first rows, one or two second rows may be arranged. If one second row is arranged in between, thyristor channels 120 are formable on two opposite sides of the second emitter layer 35, the sides being arranged parallel to the second side 24 (FIG. 10). If two second rows are arranged in between, there may be just the base layer 4 extending to the emitter sided surface in between the two neighbored second emitter layers 35 belonging to different rows (FIG. 8) or the drift layer 5 may also extend to the emitter sided surface in between two second emitter layers 35 belonging to the two neighbored second rows, so that another thyristor channel is formable from the second emitter layers 35 to the drift layer 4 in between two units.

For units arranged in line to each other, at the second sides 24 of two neighbored units, there may be either one second emitter layer 35 arranged between the two emitter contact areas 21 of the two neighbored units so that at the second emitter layer 35 IGBT channels 100 can be formed at two opposite sides of the second emitter layer 35 (FIG. 10), i.e. the units overlap. Alternatively, there may be two second emitter layers 35 arranged in between (FIG. 8). Between the two second emitter layers 35, the drift layer 5 may extend to the emitter sided surface of the wafer so that additional thyristor channels are formable (middle part of FIG. 11; i.e. between the right and left part in FIG. 11). Also shown in FIG. 11 is that units may be shifted against each other, e.g. by half the size of the unit. However, the arrangement as shown in the middle part in FIG. 11 may also be repeated at the left and right sides.

The first emitter layer 3 has a maximum first extension 32 in a plane parallel to the emitter side 22 and parallel to the second sides 24. The second emitter layer 35 has a maximum second extension 37 also in the same plane and parallel to the emitter side 22 and parallel to the second sides 24, which is larger than the first extension 32. Thus, the second emitter layer 35 projects the first emitter layer 3 on two opposite sides, i.e. both second sides 24. By such a projection, thyristor channels 120 are formable in a direction parallel to that of the IGBT channel 100.

The emitter contact area 21 and the surrounding first emitter layer 3 may also be formed as a long strip, which extends over a plurality of second emitter layers 35, alternating with the base layer 4 and the drift layer 5 at the longer side of the strip (FIG. 12). A strip shall mean that the layer has an extension (long side of the strip) in a first direction, which is larger than the extension of the strip in a second direction (short side of the strip) perpendicular to the first direction, e.g. at least two times, five times or ten times longer. In this case, the IGBT and MOS channel 100, 140 are formed in parallel, whereas the thyristor channel 120 may be formable perpendicular to the other two channels 100, 140. Thus, in a plane parallel to the emitter side 22 the plurality of second emitter layers 35 surrounded by the base layer 4 are arranged alternatingly with the drift layer 5 in a row and in the emitter contacts at least two of the plurality of second emitter layers 35 in said row at one emitter contact area 21. The emitter contact area may extend over only two second emitter layers 35 (FIG. 13) or more second emitter layers 35 (FIG. 12).

Figure 14:
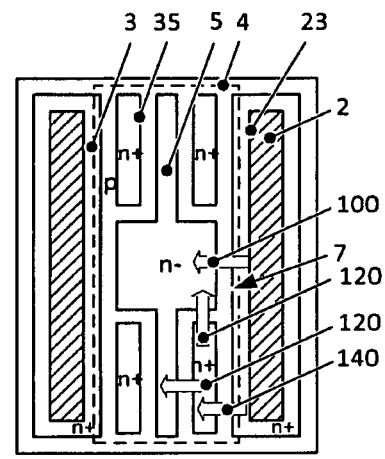

FIG. 14 shows another inventive device in which the emitter contact area 21 and the surrounding first emitter layer 3 are again formed as a long strip, which extends over a plurality of second emitter layers 35. However, in this device the drift layer 5 is also formed as a strip extending over a plurality of second emitter layers 35, i.e. the strip is formed parallel to the strip of the first emitter layer 3, i.e. in the first direction, however which strip is overlaid with wider areas of the drift layer, so that wider areas and narrower areas (strip part) of the drift layer alternate in the first direction. In between the drift layer 5 and the first emitter layer 3, second emitter layers 35 are arranged on two sides of the drift layer 3 (along the long sides of the strip). However, in the wider areas of the drift layer, no second emitter layers 35 are arranged along the first direction and in which the drift layer 5 is separated from the first emitter layer 3 only by the base layer 4. In this area, in which the drift layer is wider than the short side of the strip, the IGBT channel 100 is formed. Thyristor channels 120 are formed from the second emitter layers 35 to the drift layer 5 in a direction parallel to the IGBT channel 100 (at an area of the drift layer 5, in which the drift layer 5 is formed as a pure strip) and another thyristor channel 120 is formed from the second emitter layer 35 to the wider area of the drift layer in the second direction, i.e. perpendicular to the other thyristor channel 120. Such wider and narrower areas of the drift layer 5 may be arranged repetitively in the device.

In another embodiment, the conductivity types are switched, i.e. all layers of the first conductivity type are p type (e.g. the drift layer 5) and all layers of the second conductivity type are n type (e.g. base layer 4).

It should be noted that the term "comprising" does not exclude other elements or steps and that the indefinite article "a" or "an" does not exclude the plural. Also elements described in association with different embodiments may be combined. It should also be noted that reference signs in the claims shall not be construed as limiting the scope of the claims.

What is claimed is:

1. A power semiconductor device comprising:
   a wafer, on which wafer an emitter electrode is arranged on an emitter side of the wafer and a collector electrode is arranged on a collector side of the wafer opposite to the emitter side,
   wherein a planar gate electrode is arranged on the emitter side, which gate electrode comprises an electrically conductive gate layer and an insulating layer, which insulates the gate layer from any layer of a first or a second conductivity type, which is different from the first conductivity type, in the wafer,
   wherein layers of the first and second conductivity type are arranged between the collector and emitter sides in the following order:
   a collector layer of the second conductivity type,
   a drift layer of the first conductivity type, which drift layer has a constant doping concentration,
   an enhancement layer of the first conductivity type, which has a higher maximum doping concentration than the drift layer, which comprises a first enhancement region,
   a base layer of the second conductivity type, which comprises a first base region and a second base region,
   a first emitter layer and a second emitter layer of the first conductivity type,
   wherein the emitter electrode contacts the first base region and the first emitter layer at an emitter contact area,
   wherein the first enhancement region is arranged between the first base region and the drift layer, which first enhancement region separates the first base region from the second base region and the drift layer and which first enhancement region contacts the second emitter layer,
   wherein the first emitter layer is separated from the drift layer by the base layer and the first enhancement region,
   wherein the second emitter layer is separated from the drift layer and from the first emitter layer by the base layer,
   wherein an IGBT channel is formable from the first emitter layer via the first base region and the first enhancement region to the drift layer,
   wherein a thyristor channel is formable from the second emitter layer via the second base region to the drift layer,
   wherein a MOS channel is formable from the first emitter layer via the first base region and the first enhancement region to the second emitter layer, wherein a cascade of channels is formable from the first emitter layer to the drift layer via the MOS channel and the thyristor channel.

2. The power semiconductor device according to claim 1, characterized in that the first emitter layer is a closed layer surrounding the emitter contact area.

3. The power semiconductor device according to claim 1, characterized in that the enhancement layer further includes a second enhancement region, which is arranged between the second base region and the drift layer and which enhancement layer separates the second base region from the drift layer.

4. The power semiconductor device according to claim 1, characterized in that the emitter contact area is limited by two first sides opposite to each other in a plane parallel to the emitter, wherein the IGBT channel is formable at the two first sides of the emitter contact area.

5. The power semiconductor device according to claim 4, characterized in that the emitter contact area comprises in a plane parallel to the emitter side two second sides opposite to each other, which second sides are arranged perpendicular to the first sides, and characterized in that the MOS channel is formable at the two second sides of the emitter contact area.

6. The power semiconductor device according to claim 4, characterized in that the first emitter layer has a maximum first extension in a plane parallel to the emitter side and perpendicular to the first sides and characterized in that the second emitter layer has a maximum second extension in the same plane and parallel to the direction, in which the first extension is provided, wherein the second extension is larger than the first extension.

7. The power semiconductor device according to claim 4, characterized in that the device comprises a plurality of emitter contact areas, which are arranged in first rows with the first sides arranged perpendicular to the first rows, and a plurality of second emitter layers, which are arranged in second rows parallel to the first rows.

8. The power semiconductor device according to claim 7, characterized in that one or two of the second rows is or are arranged between two of, the first rows.

9. The power semiconductor device according to claim 1, characterized in that in a plane parallel to the emitter side a plurality of second emitter layers surrounded by the base layer are arranged alternatingly with the drift layer in a row and characterized in that the emitter electrode contacts at least two of the plurality of second emitter layers in said row at the emitter contact area.

10. The power semiconductor device according to claim 4, characterized in that a unit is formed by the emitter contact area, the surrounding first emitter layer and two second emitter layers on the opposite second sides of the emitter contact area and characterized in that the device comprises a plurality of such units, wherein the units are arranged in a regular manner.

11. The power semiconductor device according to claim 10, characterized in that in a plane parallel to the emitter side, the units are arranged in rows, wherein the two first sides of the emitter contact areas of each two neighbored units are arranged perpendicular to each other.

12. The power semiconductor device according to claim 10, characterized in that in a plane parallel to the emitter side, the units are arranged in rows, wherein the two first sides of the emitter contact areas of each two neighbored units are arranged parallel to each other.

13. The power semiconductor device according to claim 1, characterized in that the first base region has a first maximum doping concentration, and the second base region has a second maximum doping concentration, wherein the first maximum doping concentration is higher than the second maximum doping concentration, in particular the first maximum doping concentration is between $1*10^{17}$ cm$^{-3}$ and $1*10^{18}$ cm$^{-3}$ and the second maximum doping concentration is between $1*10^{16}$ cm$^{-3}$ and $1*10^{17}$ cm$^{-3}$.

14. The power semiconductor device according to claim 1, characterized in that a third base region is arranged between the first enhancement region and the drift layer.

15. The power semiconductor device according to claim 3, characterized in that the emitter contact area comprises in a plane parallel to the emitter side two first sides opposite to each other, wherein the IGBT channel is formable at the two first sides of the emitter contact area.

16. The power semiconductor device according to claim 3, characterized in that in a plane parallel to the emitter side, a plurality of second emitter layers surrounded by the base layer are arranged alternatingly with the drift layer in a row and characterized in that the emitter electrode contacts at least two of the plurality of second emitter layers in said row at the same emitter contact area.

17. The power semiconductor device according to claim 3, characterized in that the first base region has a first maximum doping concentration, and the second base region has a second maximum doping concentration, wherein the first maximum doping concentration is higher than the second maximum doping concentration, in particular the first maximum doping concentration is between $1*10^{17}$ cm$^{-3}$ and $1*10^{18}$ cm$^{-3}$ and the second maximum doping concentration is between $1*10^{16}$ cm$^{-3}$ and $1*10^{17}$ cm$^{-3}$.

18. A power semiconductor module comprising:
at least two power semiconductor devices each power semiconductor device having:
  a wafer, on which wafer an emitter electrode is arranged on an emitter side of the wafer and a collector electrode is arranged on a collector side of the wafer opposite to the emitter side,
  wherein a planar gate electrode is arranged on the emitter side, which gate electrode comprises an electrically conductive gate layer and an insulating layer, which insulates the gate layer from any layer of a first or a second conductivity type, which is different from the first conductivity type, in the wafer,
  wherein layers of the first and second conductivity type are arranged between the collector and emitter sides in the following order:
  a collector layer of the second conductivity type,
  a drift layer of the first conductivity type, which drift layer has a constant doping concentration,
  an enhancement layer of the first conductivity type, which has a higher maximum doping concentration than the drift layer, which comprises a first enhancement region,
  a base layer of the second conductivity type, which comprises a first base region and a second base region
  a first emitter layer and a second emitter layer of the first conductivity type,
  wherein the emitter electrode contacts the first base region and the first emitter layer at an emitter contact area,
  wherein the first enhancement region is arranged between the first base region and the drift layer, which first enhancement region separates the first base region from the second base region and the drift layer and which first enhancement region contacts the second emitter layer, wherein the first emitter layer is separated from the drift layer by the base layer and the first enhancement region, wherein the second emitter layer is separated from the drift layer and from the first emitter layer by the base layer, wherein an IGBT channel is formable from the first emitter layer via the first base region and the first enhancement region to the drift layer, wherein a thyristor channel is formable from the second emitter layer via the second base region to the drift layer, wherein a MOS channel is formable from the first emitter layer via the first base region and the first enhancement region to the second emitter layer, wherein a cascade of channels is formable from the first emitter layer to the drift layer via the MOS channel and the thyristor channel, the power semiconductor module characterized in that the power semiconductor module comprises an electrically conductive connection layer, which electrically connects the respective second emitter layers belonging to two neighbored power semiconductors devices of said at least two power semiconductor devices.

19. A power semiconductor module comprising
at least two power semiconductor devices, each power semiconductor device having:
 a wafer, on which wafer an emitter electrode is arranged on an emitter side of the wafer and a collector electrode is arranged on a collector side of the wafer opposite to the emitter side,
 wherein a planar gate electrode is arranged on the emitter side, which gate electrode comprises an electrically conductive gate layer and an insulating layer, which insulates the gate layer from any layer of a first or a second conductivity type, which is different from the first conductivity type, in the wafer,
 wherein layers of the first and second conductivity type are arranged between the collector and emitter sides in the following order:
 a collector layer of the second conductivity type,
 a drift layer of the first conductivity type, which drift layer has a constant doping concentration, an enhancement layer of the first conductivity type, which has a higher maximum doping concentration than the drift layer, which comprises a first enhancement region, a base layer of the second conductivity type, which comprises a first base region and a second base region a first emitter layer and a second emitter layer of the first conductivity type, wherein the emitter electrode contacts the first base region and the first emitter layer at an emitter contact area, wherein the first enhancement region is arranged between the first base region and the drift layer, which first enhancement region separates the first base region from the second base region and the drift layer and which first enhancement region contacts the second emitter layer, wherein the first emitter layer is separated from the drift layer by the base layer and the first enhancement region, wherein the second emitter layer is separated from the drift layer and from the first emitter layer by the base layer, wherein an IGBT channel is formable from the first emitter layer via the first base region and the first enhancement region to the drift layer, wherein a thyristor channel is formable from the second emitter layer via the second base region to the drift layer, wherein a MOS channel is formable from the first emitter layer via the first base region and the first enhancement region to the second emitter layer, wherein a cascade of channels is formable from the first emitter layer to the drift layer via the MOS channel and the thyristor channel, the power semiconductor module characterized in that the enhancement layer further includes a second enhancement region, which is arranged between the second base region and the drift layer and which enhancement layer separates the second base region from the drift layer, the power semiconductor module characterized in that the power semiconductor module comprises an electrically conductive connection layer, which electrically connects the respective second emitter layers belonging to two neighbored power semiconductors devices of said at least two power semiconductor devices.

* * * * *